United States Patent [19]

McAnelly et al.

[11] Patent Number: 5,106,327
[45] Date of Patent: Apr. 21, 1992

[54] ON-LINE DRAWOUT CASE RELAY AND METER TEST DEVICE

[76] Inventors: Michael L. McAnelly, P.O. Box 45891, Baton Rouge, La. 70895; Robert V. McAnelly, 5757 Corporate Blvd., Ste. 101, Baton Rouge, La. 70808

[21] Appl. No.: 624,335

[22] Filed: Dec. 7, 1990

[51] Int. Cl.⁵ ............................................. H01R 25/00
[52] U.S. Cl. ..................................... 439/651; 439/912; 439/188
[58] Field of Search ...................... 439/638, 651–655, 439/912, 915, 922, 482, 225, 219, 169, 188; 324/158

[56] References Cited

U.S. PATENT DOCUMENTS

| | | | |
|---|---|---|---|
| 3,568,136 | 3/1971 | Wells | 439/638 |
| 4,561,711 | 12/1985 | Zinich | 439/638 |
| 4,676,568 | 6/1987 | Nault et al. | 439/169 |
| 4,850,899 | 7/1989 | Maynard | 439/638 |

FOREIGN PATENT DOCUMENTS 2083294  3/1982  United Kingdom ............... 439/912

Primary Examiner—David L. Pirlot
Attorney, Agent, or Firm—William David Kiesel; Robert C. Tucker

[57] ABSTRACT

A test plug for in-service circuit system and device testing of a power system protective relays and meters utilizing the General Electric type drawout case comprising a base assembly having (i) a series of separated normally closed make-before-break test jacks to receive a test probe, and (ii) an improved male plug assembly attached to and operatively electrically connected to the base assembly and structured to be inserted into the drawout case relay or meter.

4 Claims, 6 Drawing Sheets

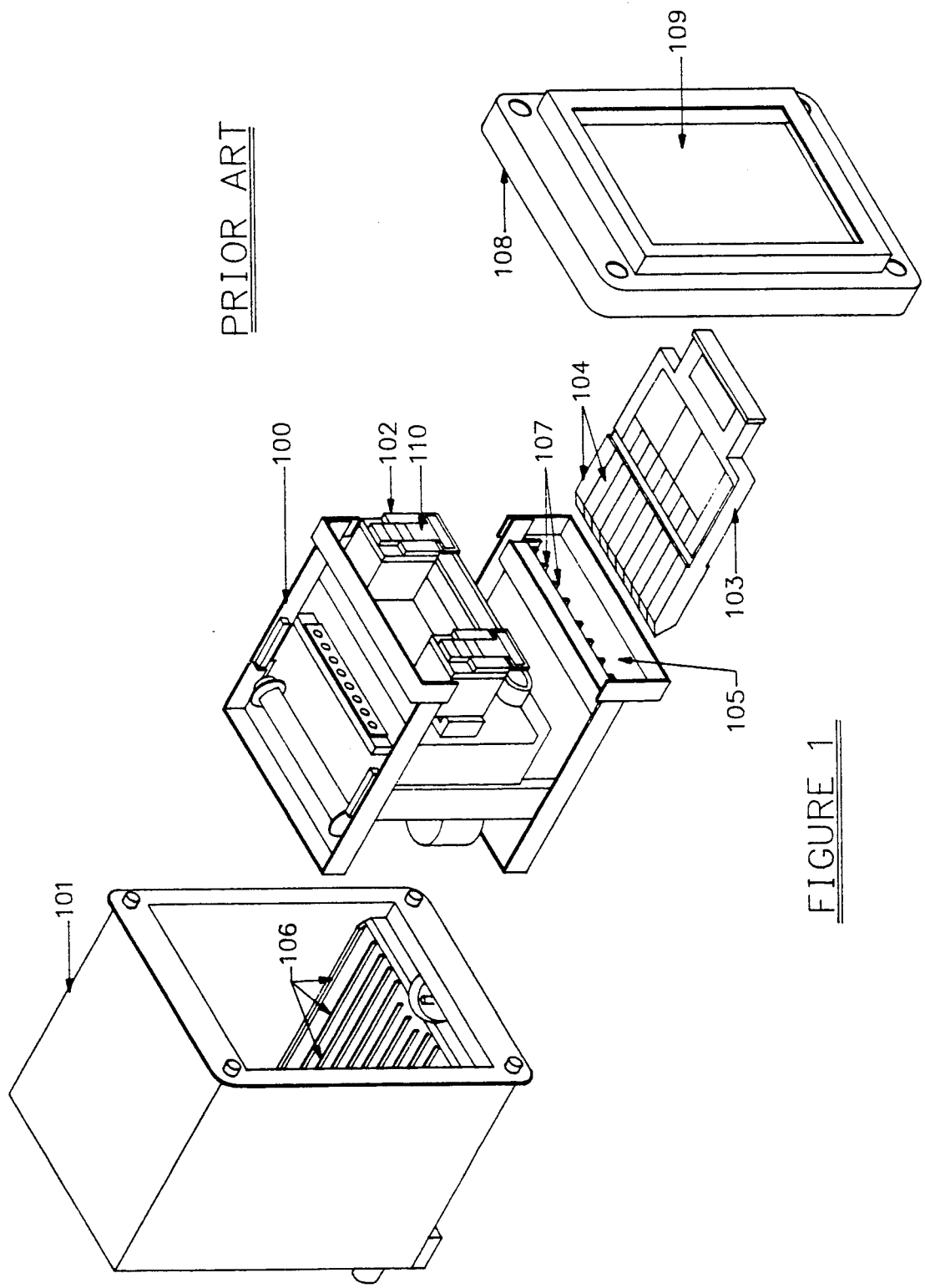

ON-LINE DRAWOUT CASE RELAY AND METER TEST DEVICE

BACKGROUND OF THE INVENTION

1. Field of the Invention

This invention relates in general to test plugs, and more particularly, to test plugs for General Electric (G.E.) type drawout relays and meters.

2. Prior Art

In power plants, substations and large industrial plants, there exists drawout case relays and meters (hereafter referred to as relays or relay systems). The majority of such relays utilize a General Electric drawout case such as illustrated in FIGS. 1 and 1A. In such a typical configuration there will exist panels containing many such relays. The relay cases are connected to the system circuitry with permanent interconnecting wiring within the relay panel. The relays are plugged into the drawout relay cases and connections are accomplished when the normal connector plugs are inserted in the connector plug slots.

These relay systems require initial and periodic relay and relay circuit testing. A test plug for use with G.E. type drawout case relays has been on the market for over thirty years. This prior art plug provides the ability to perform testing; however, operation is very difficult, time consuming, and dangerous to system equipment, circuits, and personnel. The prior art test plug requires extensive, complicated, specific wiring to perform a single test. Each additional test normally requires removal of the plug from the relay, followed by rewiring, reconnection, and reinsertion of the plug into the relay. The rewiring and reconnection procedures are very specific for each test to be conducted and for each type and make of relay. Incorrect wiring can cause: (1) false tripping of the power system, (2) opening of CT circuits resulting in very dangerous over voltages which can be fatal to personnel and cause extensive damage to equipment, and (3) inaccurate or misleading test results.

One particular problem with the prior art test plugs is that they utilize external shorting jumpers to complete the relay circuits. Not only can these jumpers become loose from vibration, but also not infrequently they are accidentally left off, both of which problems can result in dangerous consequences.

OBJECTS AND SUMMARY OF THE INVENTION

Therefore one object of this invention is to provide a test plug that will allow for easy, safe, and reliable circuit testing of relay systems utilizing G.E. type drawout cases.

Another object of this invention is to provide a test plug that allows in-service circuit testing at any individual relay terminal or case stud connection without affecting other relay circuits or disturbing relay operation.

A further object of this invention is to provide a test plug which in its normal operating configuration does not require attaching external shorting jumpers to complete the relay circuits.

A still further object of this invention is to provide a test plug that can block relay tripping or remove individual circuits from the relay by enabling individual circuits to be opened, as desired, by inserting an open circuited test probe.

Still another object of this invention is to provide a test plug which can bypass one or more current circuits in a relay without disturbing those current circuits in the system.

Another object of this invention is to provide a test plug that has protective fin type barriers to prevent personnel contact with the test jacks, the test circuits, or the jumper studs, and to prevent the accidental short-circuiting of individual circuits by the careless insertion of a test probe.

A further object of this invention is to provide a test plug for G.E. type drawout case relays of solid one piece construction that will be less susceptible to damage from normal use, from vibration or mechanical shock caused by transportation, or from mechanical shock caused by dropping or other physical abuse.

A still further object of this invention is to provide a test plug fully encapsulated in a dielectric material such as epoxy or plastic which is less susceptible to electrical conduction or electrical flashover due to contamination, moisture or system over voltage conditions.

Other objects and advantages of the invention will become apparent from the ensuing descriptions of the invention.

Accordingly, a test plug for circuit system testing of a G. E. type drawout case relays and meters is provided comprising a base assembly having (i) a series of separated normally closed make-before-break female or male test jacks to receive a conventional mating test probe, and (ii) a male plug assembly attached to and operatively electrically connected to the base assembly and structured to be operatively inserted into the drawout case relays.

In an alternate embodiment a test plug for circuit system testing of G.E. drawout case relays having a housing comprising a base assembly and a male plug assembly extending outward therefrom and shaped to be inserted into the relay or meter, wherein multiple, separated male electrical contacts are fixed in the male plug assembly and positioned relative to one another to be insertable into a corresponding set of relay female electrical contacts, wherein each male connector is electrically connected to a corresponding test jack fixed in the base assembly, and wherein the test jacks are connectable to a testing device is provided, the improvement of which comprises the male plug being of unitary construction.

In another alternate embodiment of the invention both the base assembly and the male plug assembly will be of unitary construction.

BRIEF DESCRIPTION OF THE DRAWINGS

FIG. 1 is an exploded view of a conventional G.E. drawout relay assembly including the drawout case, drawout relay, normal connector plug and case cover.

PREFERRED EMBODIMENTS OF THE INVENTION

Figure 1A:
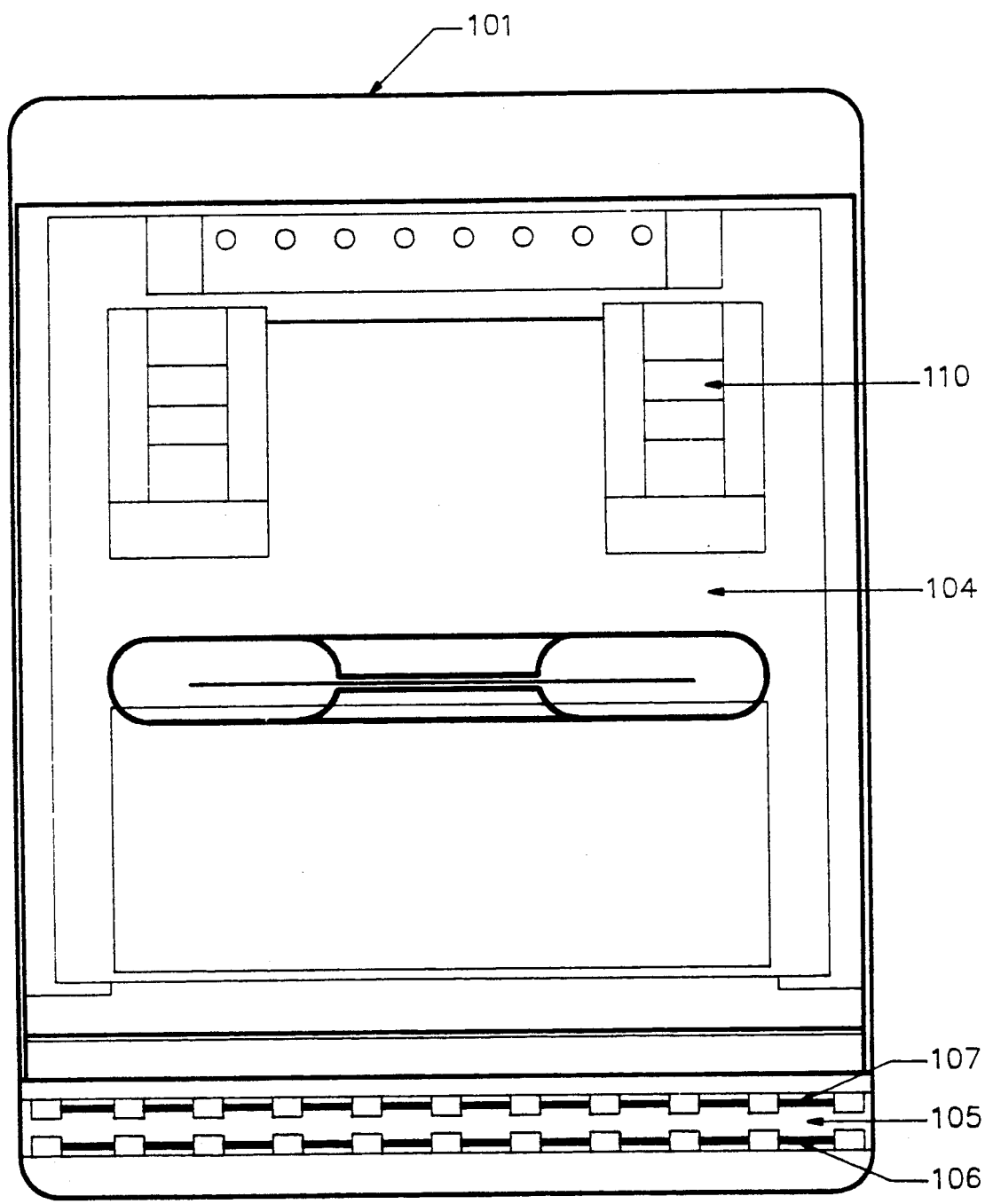
FIG. 1A is a frontal view of the assembled G.E. drawout relay assembly (without the case cover) illustrated in FIG. 1 and showing the slot where the test plug of this invention is inserted.

A conventional G.E. drawout relay assembly 100 is shown in FIGS. 1 and 1A. Assembly 100 comprises a drawout case 101 Which is electrically connected in a power station panel having multiple such relays. Inserted into case 101 is drawout relay 102 that is designed to electrically connect to pre-determined electrical circuits. During normal use a connector plug 103 having electrically separated metal strips 104 is inserted in slot 105 in a manner that strips 104 contact corresponding metal strips 106 and 107 to maintain the electrical circuits to which relay 102 may be connected. To prevent the accidental removal of plug 103, case cover 104 is attached to the front of case 101 so as to enclose plug 103 inside case 101. Cover 108 is generally provided with a transparent front section 109 to allow the reading of the relay instrumentation 110.

Figure 2:
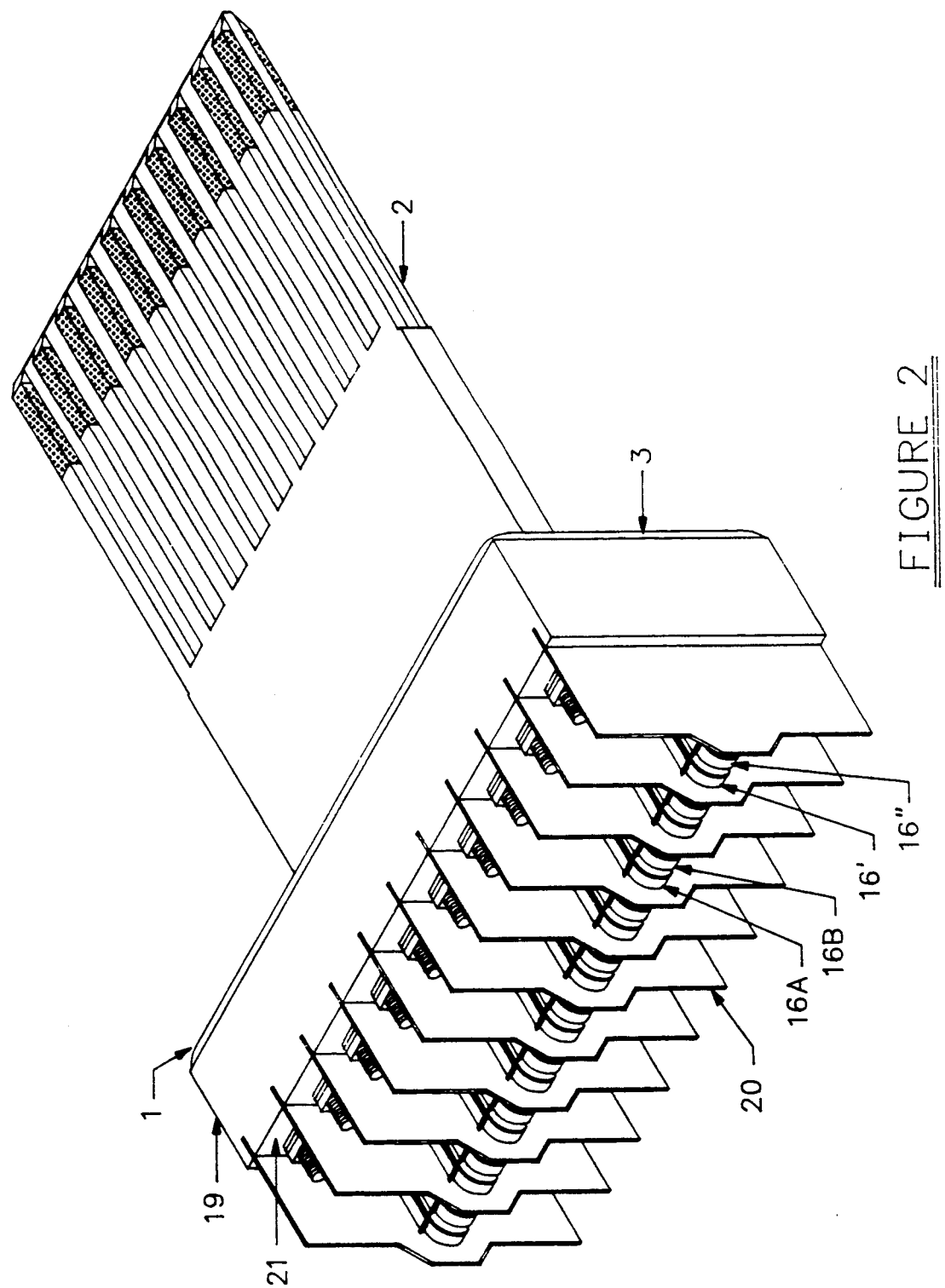
FIG. 2 is a cutaway three dimensional perspective of one preferred embodiment of the invention.

Referring now to FIG. 2 a preferred embodiment of the test plug of the invention is illustrated comprising a base assembly 1 and a male plug assembly 2 which extends perpendicularly from base assembly surface 3. As described in more detail below it is preferred that both base assembly 1 and male plug assembly 2 be of unitary construction. The preferred method of construction is cast molding the base assembly 1 and the male plug assembly 2 components together with an epoxy based material to form a single unitary construction.

Figure 6:
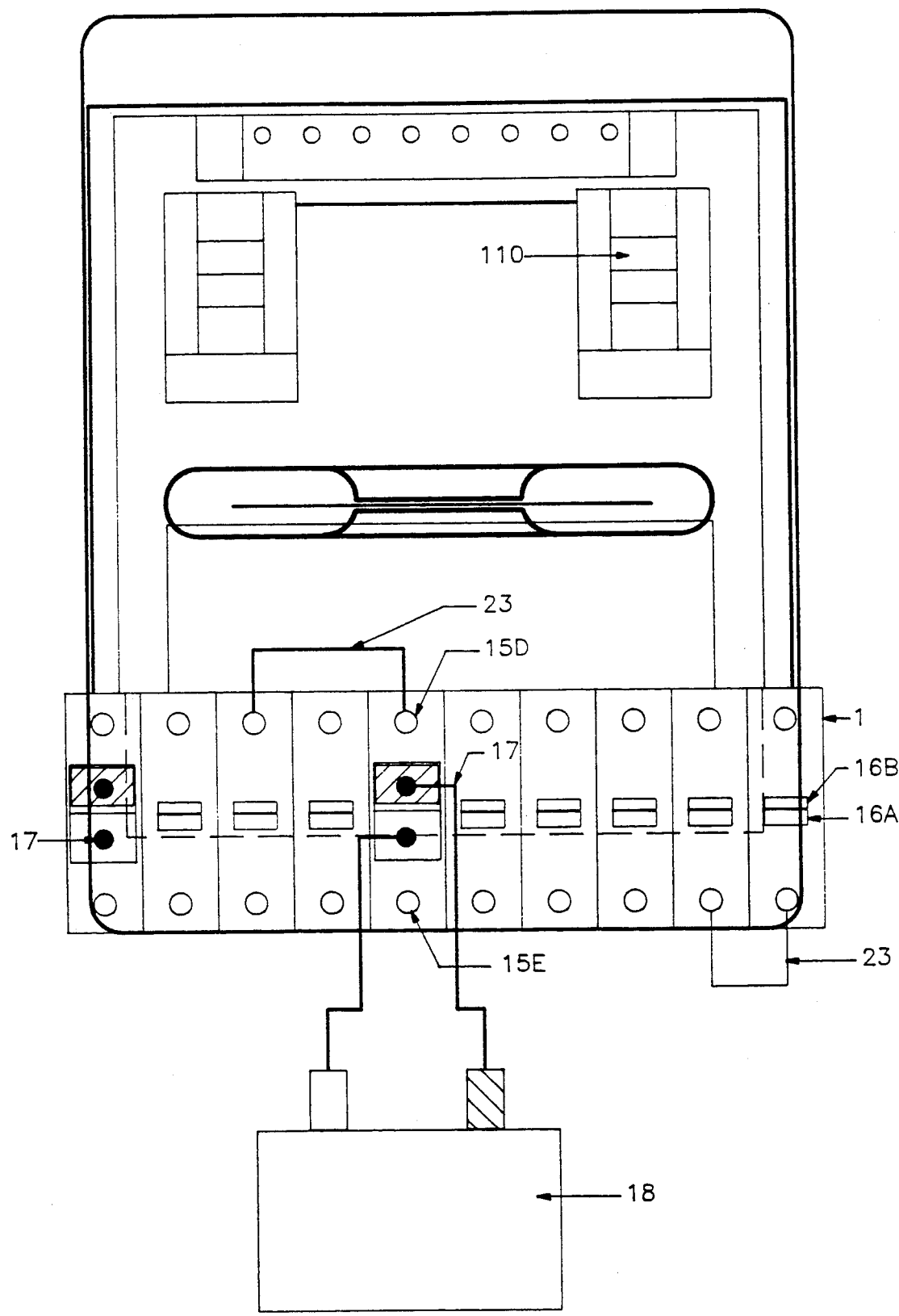
FIG. 6 is a schematic illustrating a test meter attached to the test plug of this invention which has been inserted into the G.E. drawout case of FIG. 1.

The male plug assembly 2 comprises a flat rectangular plate 4 constructed from a flexible, non-conducting material such as fiberglass reinforced plastic. In a preferred embodiment it is provided with one or more openings 5 that extend through both flat surfaces 6 and 7 of plate 4. One end s of plate 4 will be provided with a series of grooves 9A and 9B that extend between surfaces 6 and 7 and are separated from one another so that each groove 9A and 9B is aligned with one of the hollow rectangular electrical conducting tubular members 10 which are epoxied or otherwise fixed to surfaces 6 and 7 adjacent end 8. For each grooves 9A and 9B there will be an electrical wire 11A and 11B, respectively, placed in the groove. Wires 11A and 11B will be soldered to each of tubular members 10A and 10a, respectively, in order to rigidly fix them in position in grooves 9A and 9B. Wires 11A and 11B will extend down each side of plate 4 adjacent surfaces 6 and 7 and then be bent to so that each end 11a and 11b of wires 11A and 11B is soldered or otherwise fixedly attached to shoulder section 13 and 14, respectively, of studs 15a and 15b, respectively. Studs 15a and 15b are fixed to and extend through block 15c where they are electrically connected to female jack assembly prongs 16a and 16b, respectively, that make up female jack assembly 16 (commonly referred to as a normally closed, make-before-break jack). Jumper studs 15d and 15e provide auxiliary means for attaching jumper wire 23 as illustrated in FIGS. 6. Female jack assembly 16 is shaped to receive the test probe 17 (see FIG. 3) of the testing device 18 in a manner not to break a circuit before establishing a new electrical circuit through the testing device 18. There are other configurations for such jacks, and within the scope of this invention any of these other configurations can be used with the appropriate test probe being substituted for the particular design illustrated in the figures.

Figure 3:
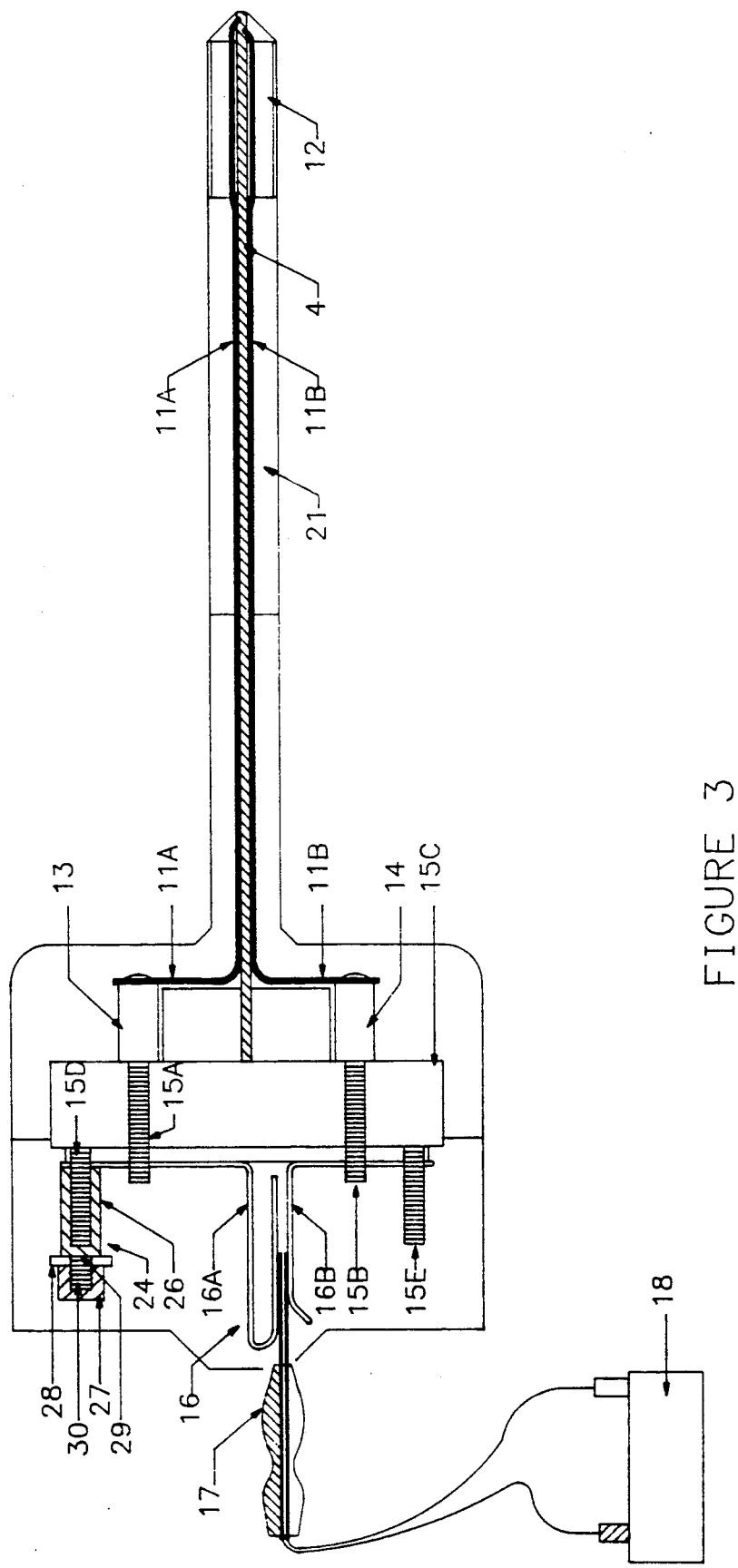
FIG. 3 is a cross-sectional view taken along lines I—I of FIG. 1 illustrating the female jack assemblies of the test plug base assembly having a test probe operatively inserted therein.
Figure 4:
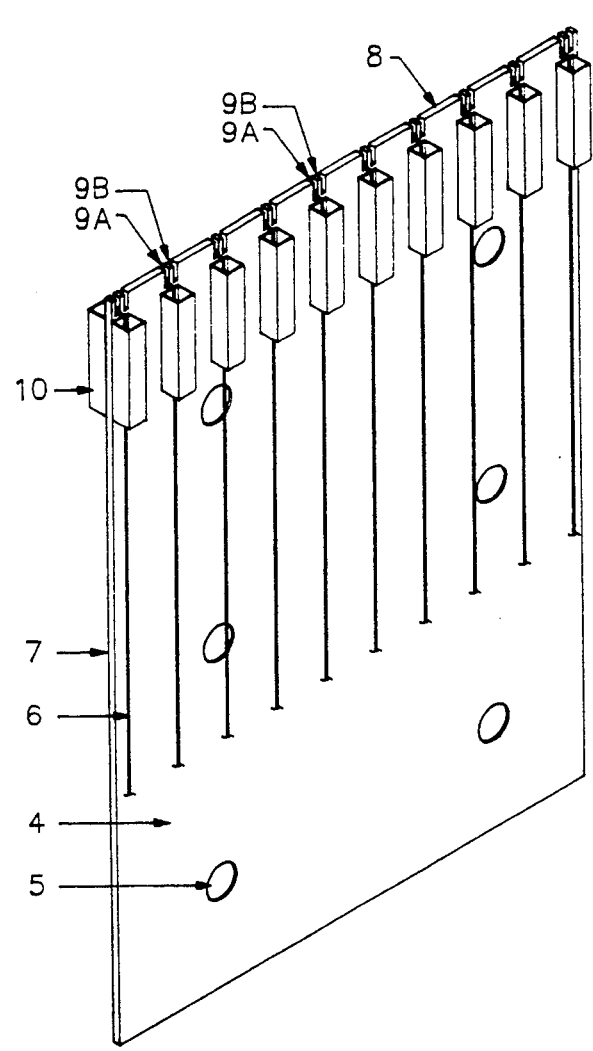
FIG. 4 is a three dimensional perspecive view of a preferred embodiment of the non-electrical conducting plug assembly plate.
Figure 5:
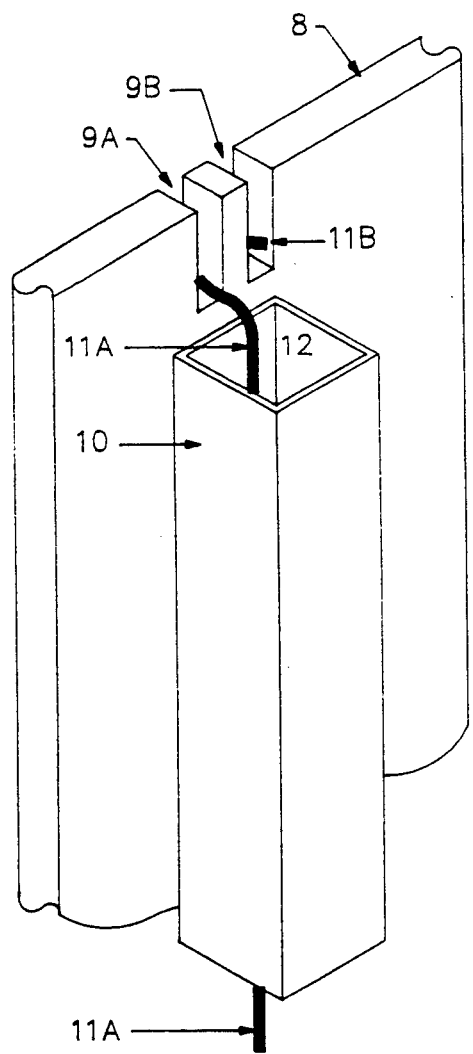
FIG. 5 is a cutaway partial view of the plug assembly plate to which has been attached a preferred embodiment hollow tubing member.

Referring now to FIGS. 2 and 3 a preferred embodiment of base assembly 1 comprises a base plate 19 having a series of fin members 20 and extending perpendicularly down from surface 21 of base plate 19 with one fin member 20 positioned between adjacent jack assemblies 16, as well as on the outside of end jack assemblies 16' and 16''.

In a more preferred embodiment each fin member 20 will be shaped to completely vertically block one set of jumper studs 15d and 15e and female jack assembly 16 from the adjacent sets of jumper studs and female jack assemblies in order to reduce the possiblity of accidently electrically connecting adjacent jumper studs or female jack assemblies when it is not desired to do so.

In a most preferred embodiment base plate 19, fin members 20 and the outer coating 21 of plate 4 will be molded of a non-electrical conducting material such as an epoxy-based resin so as to form a unitary body construction that rigidly positions the tubular members 10, jumper studs 15d and 15e, and female jack assembly 16 in place relative to one another. In this embodiment the resin will fill plate openings 5 as well as each passageway 12 of tubular members 10A and 10B. Such a structure will be better able to withstand the shocks and trauma that test plugs are submitted to. In addition the likelihood that an electrical connection will become loose or an electrical short will occur has been substantially reduced over prior art test plugs.

In an alternate preferred embodiment shown in FIG. 3 post extenders 24 are provided with a threaded opening 25 which can be screwed onto jumper studs 15d or 15e. A metal shank 26 extends perpendicularly at post extender's end opposite opening 25 which is threaded at its protruding end section 30 to receive cap 27. If it is desired to electically connect two adjacent jumper studs, then a metal bar 28 having openings 29 located to fit over adjacent end sections 30 is positioned on adjacent shanks 26 as shown and caps 27 are screwed onto end section 30 to securely hold metal jumper wire or bar 23 in place.

In operation the normal connector plug of the G.E. draw out relay assembly is removed and male plug assembly 2 is inserted into the slot vacated by the removed connector plug until electical contact has been made. The user then decides what test they wish to run. FIG. 6 depicts one of the common possible test configurations which can be made with the test plug. The test probe 17 is inserted into the appropriate female jack assembly 16 for the particular test desired after the test meter has been connected to the particular test probe. If a jumper line 23 is desired it is connected by attaching to the appropriate jumper studs 15 and secured by cap 27.

Another advantage of this invention is that male plug assembly 2 may be inserted into the drawout case relay or meter either right side up or upside down. In another preferred embodiment the female jack assembly positions can be indicated by numbers or color codes, so as to reduce the possiblity of inserting the test probe 17 or test meter 22 into the wrong female jack assembly 16.

There are of course other alternate embodiments which are obvious from the foregoing descriptions of the invention which are intended to be included within the scope of the invention as defined by the following claims.

What I claim is:

1. In a test plug for circuit system testing of a drawout case relay or meter having a housing comprising a base assembly and a plug assembly perpendicularly extending outward therefrom and shaped to be inserted into the relay or meter, wherein multiple, separated connectors are fixed in the plug assembly and positioned relative to one another to be insertable into a corresponding relay/meter connector, wherein each connector is electrically connected to a corresponding connector fixed in the base assembly, and wherein the connectors fixed in the base assembly are connectable to a testing device, the improvement of which comprises said plug assembly comprising:
    (a) a non-electrical conducting plate having at least one opening extending through said plate,
    (b) a first series of hollow tubing members constructed from electrical conducting material and separated from one another and fixed at one end of one side of said plate,
    (c) a second series of hollow tubing members constructed from electrical conducting material and separated from one another and fixed to the other side of said plate in a position opposite said first series whereby for each tubing member of said first series there is a corresponding tubing member of said second series,
    (d) a series of electrical conducting wire members, one being fixed to an inside wall surface forming the cavity of each of said tubing members and extending to a corresponding connector in said base assembly, and
    (e) a rigid, non-electrical conducting material covering both said wire members and said plate, and which fills both each of said openings in said plate and said hollow tubing member cavities, whereby only a portion of the exterior surfaces of said hollow tubing members remain exposed.

2. In a test plug according to claim 1 wherein said rigid, non-electrical conducting material is an epoxy based material.

3. A test plug for in-service circuit system and device testing of power system protective relays and meters utilizing a General Electric type drawout case comprising:
    (i) a base assembly having a series of separated normally closed make-before-break test jacks to receive a test probe, wherein said base assembly further comprises at least one electrical jumper stud electrically connected to each of said test jacks and extending perpendicularly from a bottom plate of said base assembly, each of said jumper studs shaped to receive and fixedly position an electricity conducting means in electrical contact with at least two adjacent jumper studs, and
    (ii) a plug assembly attached to and operatively electrically connected to the base assembly and structured to be operatively inserted into said drawout case, wherein said plug assembly further comprises a non-electrical conducting plate having at least one opening extending through said plate, a first series of members constructed from electrical conducting material and separated from one another and fixed at one end of one side of said plate, a second series of members constructed from electrical conducting material and separated from one another, and electrically separated from said first series, and fixed to the other side of said plate in a position opposite said first series whereby for each member of said first series there is a corresponding member of said second series, a series of electrical conducting wire members, one being fixed to the surface of each member of said first and second series and extending to a corresponding jack assembly in said base assembly, and a rigid, non-electrical conducting material covering both said wire members and said plate, and which fills each of said openings in said plate, whereby only exterior surfaces of said members which are not affixed to said plate remain exposed.

4. A test plug for in-service circuit system and device testing of power system protective relays and meters utilizing a General Electric type drawout case comprising:
    (i) a base assembly having a series of separated normally closed make-before-break test jacks to receive a test prove, wherein said base assembly further comprises at least one electrical jumper stud electrically connected to each of said test jacks and extending perpendicularly from a bottom plate of said base assembly, each of said jumper studs shaped to receive and fixedly position an electricity conducting means in electrical contact with at least two adjacent jumper studs, and
    (ii) a plug assembly attached to and operatively electrically connected to the base assembly and structured to be operatively inserted into said drawout case, wherein said plug assembly further comprises a first series of male electrical contacts separated from one another and fixed at one end of one side of said plate, a second series of male electrical contacts separated from one another, and electrically separated from said first series, and fixed to the other side of said plate in a position opposite said first series whereby for each member of said first series there is a corresponding electrical contact of said second series, a series of electrical conducting wire members, one being fixed to each of said electrical contacts and extending to a corresponding test jack in said base assembly, and a rigid, non-electrical conducting material covering both wire members and said plate in a manner to leave only portions of the exterior surfaces of said members exposed.

* * * * *